United States Patent [19]
Hoffmann et al.

[11] Patent Number: 4,885,748
[45] Date of Patent: Dec. 5, 1989

[54] METHOD AND CIRCUIT CONFIGURATION OF THE PARALLEL INPUT OF DATA INTO A SEMICONDUCTOR MEMORY

[75] Inventors: Kurt Hoffmann, Taufkirchen; Hans-Dieter Oberle, Puchheim; Rainer Kraus, Munich; Oskar Kowarik, Grafing; Manfred Paul, Unterfoehring, all of Fed. Rep. of Germany

[73] Assignee: Siemens Aktiengesellschaft, Munich, Fed. Rep. of Germany

[21] Appl. No.: 168,668

[22] Filed: Mar. 16, 1988

[30] Foreign Application Priority Data

Mar. 16, 1987 [DE] Fed. Rep. of Germany ....... 3708527

[51] Int. Cl.$^4$ .............................................. G11C 29/00
[52] U.S. Cl. ..................................... 371/21.3; 371/27; 365/201
[58] Field of Search .................... 371/21, 27, 68, 70, 371/15, 24; 365/200, 201

[56] References Cited

U.S. PATENT DOCUMENTS 4,044,340 8/1977 Itoh .
4,055,754 10/1977 Chesley .

FOREIGN PATENT DOCUMENTS 0055594 7/1982 European Pat. Off. .
.0083099 7/1983 European Pat. Off. .

OTHER PUBLICATIONS

Integration To VLSI Journal, vol. 2, No. 4, Dec. 1984, pp. 309–330, Elsevier Science Publishers B.V. Amsterdam, NL; K. K. Saluja et al: "Testable Design of Large Random Access Memories", p. 321, lines 7–20, p. 324, lines 17–28, Figures 8, 9, and 11.
IEEE Transactions On Electron Devices, vol. Ed-32, No. 2, Feb. 1985, pp. 508–515, IEEE, New York, U.S.; Y. You et al.: "A Self-Testing Dynamic RAM Chip"; p. 511. Left col., line 26–Right col., line 14, p. 514, left col., lines 22–26.
IEEE Journal of Solid–State Circuits, vol. SC-21, No. 5, Oct. 1986, pp. 635–642, IEEE, New York, U.S.; H. Mc Adams et al.: "A 1-Mbit CMOS dynamic RAM with design –for test functions", p. 638, Right col., lines 35–55; and FIG. 7.

Primary Examiner—Jerry Smith
Assistant Examiner—Robert W. Beausoliel
Attorney, Agent, or Firm—Herbert L. Lerner; Laurence A. Greenberg

[57] ABSTRACT

A method and circuit configuration for the parallel input of data items in the form of a test pattern into a block of a semiconductor memory having a plurality of storage cells. For test purposes, data items are simultaneously input in parallel into the storage cells.

13 Claims, 3 Drawing Sheets

METHOD AND CIRCUIT CONFIGURATION OF THE PARALLEL INPUT OF DATA INTO A SEMICONDUCTOR MEMORY

BACKGROUND AND PRIOR ART

The invention relates to a method for the parallel input of data in the form of a test pattern into storage cells of a semiconductor memory, and to a circuit configuration in particular for the implementation of the method, including a semiconductor memory having a least one block of $2^{N+M}$ storage cells disposed in the form of a matrix, word lines and internal bit lines through which the storage cells can be addressed, word line decoders for activating the word lines, and bit line decoders for activating the internal bit lines, an internal evaluator circuit assigned to each internal bit line for dividing the internal bit lines into two halves, a transfer transistor pair connecting each internal evaluator circuit to an external collective bit line common to all of the transfer transistor pairs, and an external evaluator circuit connected the external collective bit line on one hand for amplifying data read out from the semiconductor memory and for finally transmitting the amplified data, and on the other hand for receiving data input into the semiconductor memory from a data input circuit in the form of logic levels and for transferring this data to the external collective bit line.

Semiconductor memories, in particular integrated semiconductor memories of the RAM-type (DRAM, SRAM) currently have a large storage capacity (e.g. 1MB×1). In the past the storage capacity which can be attained has quadrupled every three to four years. Regarding the testing of such semiconductor memories, it is known that the time required to perform the tests in dependence upon the test patterns to be applied to the semiconductor memory increases at least by a factor of $2^N$ with an increase in the storage size of a factor N.

In order to save test time, European Patent Application No. 01 86 040, corresponding to allowed U.S. application Ser. No. 811,932 has proposed that a semiconductor memory be internally divided into a plurality of identical blocks, that these be operated in parallel during test operation, and that the majority of the possibly occurring faults be detected through an analysis circuit. In practice it is possible to divide a semiconductor memory into four or eight identical blocks along these lines without any noticeable increase in the additional outlay of wiring and circuitry. However, division into substantially more blocks necessitates an increased additional outlay of circuitry and wiring which, in the case of integrated semiconductor memories, has a negative influence, in particular on the base or chip surface area requirement. U.S. Pat. No. 4,055,754 discloses a test circuit which permits a column-parallel readout of all of the storage cells of one single word line, wherein all of the storage cells of the word line which is to be read are to contain the same information. However, information is input into the storage cells in a traditional fashion.

It is accordingly an object of the invention to provide a method and circuit configuration for the parallel input of data into a semiconductor memory, which overcomes the hereinafore-mentioned disadvantages of the heretofore-known methods and devices of this general type and which permits storage cells of a semiconductor memory to be written into in the shortest possible time with the least possible additional outlay of circuitry and space in comparison to prior art semiconductor memories.

SUMMARY OF THE INVENTION:

With the foregoing and other objects in view there is provided, in accordance with the invention, a method for the parallel input of data items in the form of a test pattern into a block of a semiconductor memory including a plurality of storage cells and internal evaluator circuits in the block, internal bit lines connected to the storage cells and the internal evaluator circuits, an external collective bit line having first and second halves connected to the internal bit lines, transfer transistor pairs connected to the internal bit lines, and at least one word line connected to the (storage cells, which comprises:
(a) switching all of the internal evaluator circuits into an inactive state;
(b) precharging all of the internal bit lines to a given precharge level;
(c) charging the first half of the external collective bit line to a first logic level, charging the second half of the external collective bit line to a second logic level complementary to the first logic level, at least one of the logic levels corresponding to data items to be input;
(d) switching the transfer transistor pairs assigned to at least two of the internal evaluator circuits into electrical conductivity for feeding the logic levels occurring on the external collective bit line to the internal bit lines;
(e) driving the at least one word line connected to the storage cells while inputting desired data items into storage cells connected both to a driven word line and to internal bit lines associated with transfer transistor pairs having been switched into electrical conductivity;
(f) repeating step (e) while driving at least one previously undriven word line for each repetition until data has been input into all of the storage cells of the block which can be written into on the basis of the selected assignment between the external collective bit line and the two logic levels; and
(g) repeating steps (b) through (f) while interchanging the originally selected assignment between the external collective bit line and the two logic levels if the desired test pattern has not yet been written into all of the storage cells after the last repetition of step (f).

In accordance with another mode of the invention, there is provided a method which comprises switching into conductivity at least the internal evaluator circuits associated with transfer transistor pairs having been switched into electrical conductivity, and repeating step (a) before each repetition of steps (b) through (f), in order to accelerate the input of the data items into the storage cells in accordance with step (d).

In accordance with a further mode of the invention, there is provided a method which comprises initially selecting a logical "0" or a logicl "1" as the first logic level.

In accordance with an added mode of the invention, there is provided a method which comprises applying steps (a) through (g) simultaneously and in parallel to storage blocks of semiconductor memories including a plurality of mutually identical storage blocks.

With the objects of the invention in view there is also provided a circuit configuration for the parallel input of data items in the form of a test pattern into a block of a semiconductor memory, comprising: a semiconductor memory including at least one block having $2^{N+M}$ storage cells disposed in the form of a matrix; word lines and internal bit lines connected to the storage cells for addressing the storage cells; word line decoders connected to the word lines for activating the word lines; bit line decoders connected to the internal bit lines for activating the internal bit lines; internal evaluator circuits each being assigned to a respective one of the internal bit lines and dividing the internal bit lines into two halves; transfer transistor pairs each being connected to a respective one of the internal evaluator circuits; and external collective bit line being connected to the transfer transistor pairs and having first and second halves; a data input circuit; an external evaluator circuit connected between the external collective bit line and the data input circuit for amplifying data read out from the semiconductor memory, for transmitting the amplified data, for receiving data input in the form of logic levels into the semiconductor memory from the data input circuit and for transferring the received data to the external collective bit line; respective switching transistors each being connected to the data input circuit for feeding respective potentials assigned in value to the two logic levels, to the data input circuit; a control circuit having an input receiving control signals containing information as to whether or not parallel input is to take place and as to which test pattern is to be used therefor; the control circuit having a first output connected to one of the switching transistors for feeding a first output signal driving the one switching transistor, the control circuit having a second output connected to the data input circuit for feeding a second output signal controlling the data input circuit as to which of the potentials is to be applied as the first logic level through the external evaluator circuit to the first half of the external collective bit line and which of the potentials is to be applied as the second logic level through the external evaluator circuit to the second half of the external collective bit line, the control circuit having at least one third output connected to the bit line decoders for feeding at least one third output signal; and the bit line decoders having a switch-over device receiving the at least one third output signal for the parallel activation of at least a plurality of the transfer transistor pairs.

In accordance with another feature of the invention, the control circuit includes a decoder section analyzing the control signals, and/or a PLA-circuit and/or a nonvolatile storage circuit.

In accordance with an added feature of the invention, the bit line decoder has an output, the transfer transistor pair is a first transfer transistor pair formed of two transistors with gate terminals, the switch-over device includes a second transfer transistor pair formed of first and second mutually-complementary transistors for each internal bit line having gate, source and drain terminals, the source and drain terminals of the first transistor of the second transistor pair is connected between the gate terminals of the first transfer transistor pair of an internal bit line and the output of the bit line decoder assigned to a respective internal bit line, the second transistor is connected between a supply potential of the circuit configuration and the gate terminals of the first transfer transistor pair, and the gate terminals of the first and second transistors of the second transfer transistor pair are connected to the third output of the control circuit.

In accordance with an additional feature of the invention, the at least one third output of the control circuit is in the form of three third outputs for feeding three third output signals, the bit line decoder has an output, the transfer transistor pair is a first transfer transistor pair formed of two transistors with gate terminals, the switch-over device includes a plurality of second transfer transistor pairs each being formed of first and second mutually-complementary transistors for each internal bit line having gate, source and drain terminals, the source and drain terminals of the first transistor of each of the second transistor pairs is connected between the gate terminals of the first transfer transistor pair of an internal bit line and the output of the bit line decoder assigned to a respective internal bit line, the second transistor of each of the second transistor pairs are connected between a supply potential of the circuit configuration and the gate terminals of the first transfer transistor pair, and the gates of the first and second transistors of all of the second transfer transistor pairs are connected in groups to the third outputs of the control circuit.

In accordance with a concomitant feature of the invention, the control circuit has a fourth output feeding a fourth output signal, and there are provided address lines for addressing the word lines, a word line address separating circuit having an input connected to the fourth output and to the address lines, the rod line address separating circuit having means for switching through the word lines to the word line decoders in normal operation and means for blocking the address lines and for driving the word line decoders in test operation, so that the address lines drive at least one word line in sequence for inputting, or for driving all of the word line decoders in parallel so that the address lines drive all of the word lines simultaneously for inputting.

Other features which are considered as characteristic for the invention are set forth in the appended claims.

Although the invention is illustrated and described herein as embodied in a method and circuit configuration for the parallel input of data into a semiconductor memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 1:
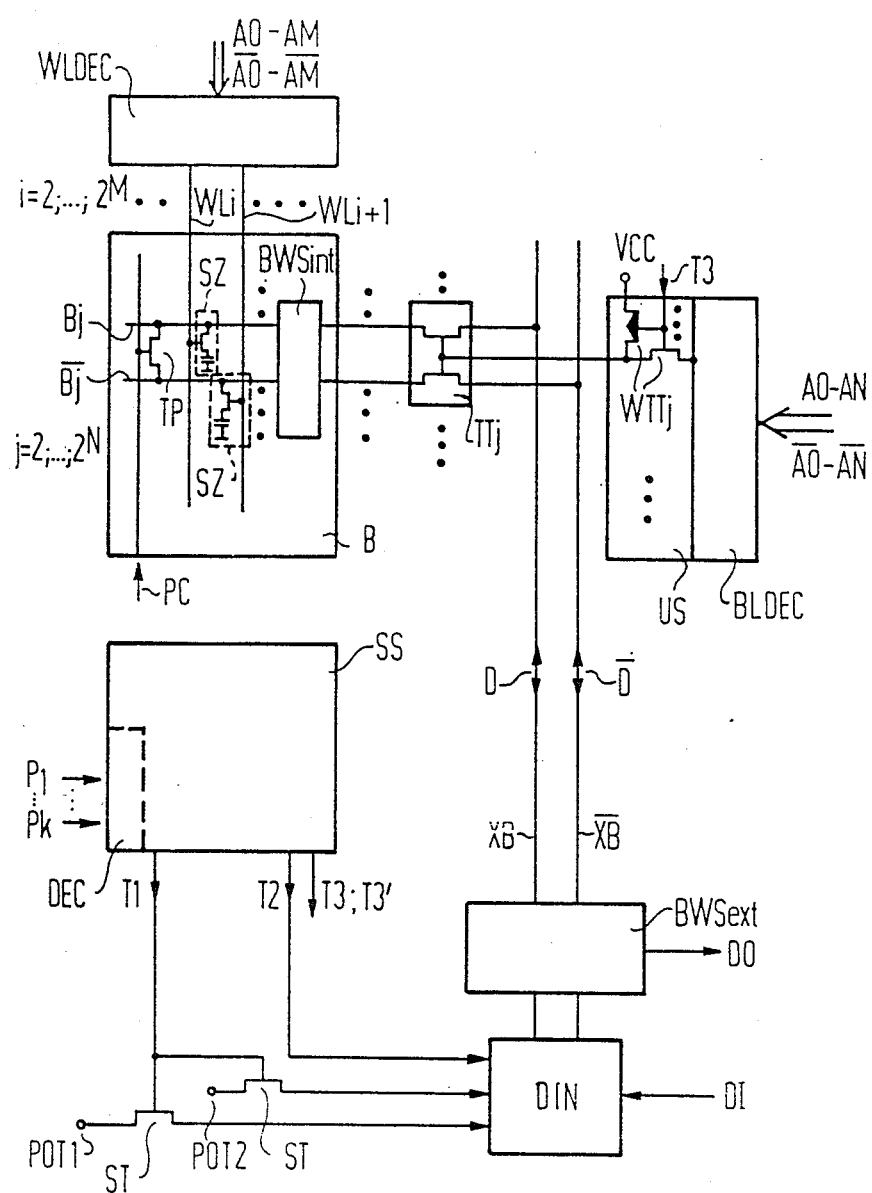
FIG. 1 is a schematic and block diagram of a circuit configuration according to the invention.

DESCRIPTION OF THE PREFERRED EMBODIMENTS:

Referring now to the figures of the drawings in detail and first, particularly, to FIG. 1 thereof, there is seen a circuit configuration according to the invention including a block B of a semiconductor memory which contains $2^{N+M}$ conventional storage cells SZ. When a DRAM is used as the semiconductor memory, the storage cells are generally so-called 1-transistor storage cells. The storage cells SZ are disposed in the usual way in the form of a matrix composed of rows and columns. The column-by-column addressing is carried out through word lines WLi, and the row-by-row addressing through bit lines Bj, $\overline{Bj}$. The information items read out from the storage cells SZ are evaluated and pre-amplified in internal evaluator circuits BWSint. One internal evaluator circuit BWSint is provided for each row of storage cells SZ.

Two fundamentally different bit lie concepts are known: On one hand the historically earlier so-called open bit-line concept and on the other hand the so-called folded bit-line concept. Both concepts are described and illustrated in U.S. Pat. No. 4,044,340. The present invention can be applied to both bit line concepts, but in order to simplify the description, it will be explained by making reference only to the folded bit-line concept.

Generally, each bit line is assigned an internal evaluator circuit BWSint. This means that in the case of the folded bit-line concept, each internal evaluator circuit BWSint is connected to two parallel bit line halves Bj, $\overline{Bj}$ which together form one single bit line. This configuration corresponds to a left-hand and a right-hand bit-line half between which an evaluator circuit is disposed in the case of the open bit-line concept. In the following description, the two-bit line halves will be referred to as a whole as an "internal bit line Bj, $\overline{Bj}$".

The advantageous circuit configuration also includes an external evaluator circuit BWSext which is connected to an external collective bit-line including a first collective bit-line half (XB) and a second collective bit-line half ($\overline{XB}$). Each external collective bit line XB, $\overline{XB}$ is connected through a respective transfer transistor TTj to an internal bit line Bj, $\overline{Bj}$ and to the associated internal evaluator circuit BWSint. When data is read out from the semiconductor memory, the external evaluator circuit BWSext serves to amplify the readout data item, which has been evaluated and pre-amplified by one of the internal evaluator circuits BWSint, and it also serves to transfer the data item DO to a non-illustrated data output buffer circuit, for example.

However, when data items DI are input into the semiconductor memory, the external evaluator circuit BWMext also serves to receive data items DI, which are to be input from a data input circuit DIN that is connected to the external evaluator circuit BWSext and it serves to forward the data item to the external collective bit line XB, $\overline{XB}$, from where it is input through an appropriately activated internal bit line Bj, $\overline{Bj}$ into an addressed storage cell SZ.

In the usual way, the word lines WLi can be activated, i.e. selected, by word line decoders WLDEC, and the internal bit lines Bj, $\overline{Bj}$ can be activated or selected by bit line decoders BLDEC and the aforementioned pairs of transfer transistors TTj. Advantageously, the data input circuit DIN is also connected to two potentials POT1, POT2 which are assigned in value to two mutually-complementary logic levels D, $\overline{D}$ which in turn correspond to the possible signal values of the data items DI which are to be input. In general the potentials POT1, POT2 are equal in value to the possible signal values of the data items DI and are even equal to supply voltages VCC, VSS of the semiconductor memory itself. However, this is not necessary to the implementation of the present invention. The connection of the two potentials POT1, POT2 to the data input circuit DIN in each case takes place through a switching transistor ST.

The circuit configuration in accordance with the invention also includes a control circuit SS. Inputs of the control circuit SS are connected to control signals Pl to Pk. During the practical operation of the circuit configuration, the control signals Pl to Pk contain information as to whether or not a parallel input is to take place and which test pattern is to be used in the parallel input. A first output signal T1 of the control circuit SS drives the gates of the switching transistors ST. The switching transistors ST are switched through by means of the first output signal T1 only when storage cells SZ of the driven block B are to be written into in parallel.

A second output signal T2 is connected to the data input circuit DIN. In the case of a parallel input, within the data input circuit DIN it controls which of the potentials POT1, POT2 connected through the switching transistors ST is to be connected as the logic level D through the external evaluator circuit BWSext to the first half XB of the external collective bit line XB, $\overline{XB}$, and which of the potentials POT1, POT2 connected through the switching transistors ST is to be connected as the logic level $\overline{D}$ through the external evaluator circuit BWSext to the second half $\overline{XB}$ of the external collective bit line XB, $\overline{XB}$. The value of the logic levels D and $\overline{D}$ is determined by the test pattern which is to be input into the memory and by the current addressing of the storage cells SZ.

A switch-over device US permits the simultaneous driving of several of or all of the internal bit lines Bj, $\overline{Bj}$ through the associated pairs of transfer transistors TTj. In accordance with the invention, the switch-over device US includes, for example, one pair of further transfer transistors WTTj for each output of the bit line decoders BLDEC, i.e. for each internal bit line Bj, $\overline{Bj}$. The first further transfer transistor of such a pair WTTj is formed, for example, of an n-channel transistor. The source and drain of the first further transfer transistor are connected between the assigned decoder output of the bit line decoder BLDEC and the gates of the transfer transistor pair TTj which is assigned to the respective bit line Bj, $\overline{Bj}$. The second further transfer transistor of such a pair WTTj is accordingly selected, for example, as a p-channel transistor, the source thereof is connected to the supply potential VCC of the semiconductor memory and the drain thereof is connected to the gates of the corresponding transfer transistor pair TTj. The gates of both of the transistors of the further pair of transfer transistors WTTj are connected to a third output signal T3 of the control circuit SS. In a first embodiment of a switch-over device US shown in FIG. 1, the gates of all of the further transfer transistor pairs WTTj are connected to one single output signal T3 of the control circuit SS. In normal operation, the third output signal T3 is activated so that the n-channel transistors of all of the further transfer transistor pairs WTTj are switched through, i.e. the gates of the transfer transistor pairs TTj are driven by the signals which occur at the output of the bit line decoders BLDEC.

In test operation, for the parallel input of data into a plurality of storage cells SZ on at least one word line WLi, the third output signal T3 is deactivated so that although all of the n-channel transistors of the further transfer transistor pairs WTTj are blocked, the corresponding p-channel transistors are conductive. The gates of all of the transfer transistor pairs TTj are supplied with the potential VCC, i.e. all the transfer transistor pairs TTj are switched through. Thus the data item D,$\overline{D}$ which is supplied through the external collective bit line XB,$\overline{XB}$ can be input into all of the storage cells SZ which are connected to an activated word line WLi. In this way simple test patterns, such as "All 0's"; "All 1's"; "one half 0 and one half 1" can be input into a block B of a semiconductor memory very rapidly and without noticeable additional outlay with respect to surface area.

Figure 3:
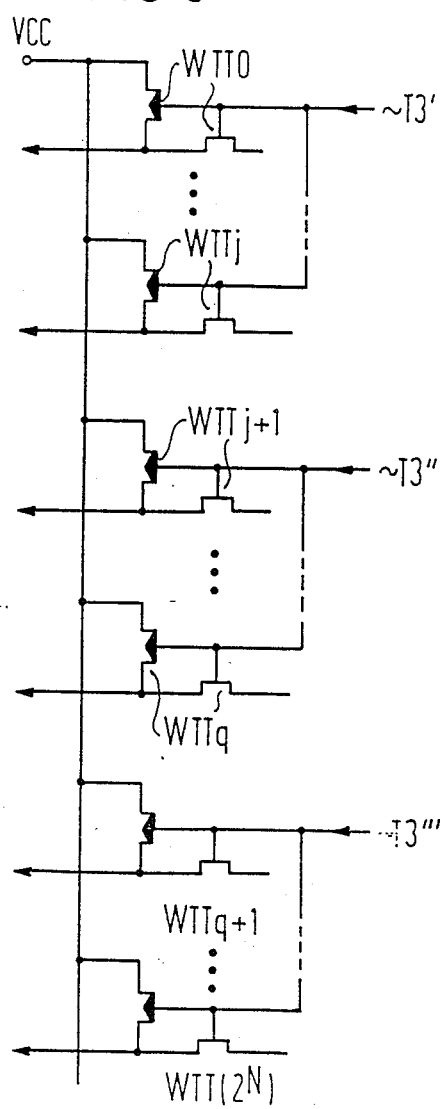
FIG. 3 is a diagram of a switch-over device.

In a further advantageous embodiment of the switchover device US seen in FIG. 3, the gates of the further transfer transistor pairs WTTj are not all connected to the third output signal T3 of the control circuit SS. Instead, the control circuit SS includes a plurality, i.e. at least two, mutually independent third output signals T3. In the FIG. 3 embodiment, three signals T3',T3",T3''' are provided. Furthermore, the gate terminals of the further transfer transistor pairs WTTj are combined to form a plurality, in other words at least two, mutually independent groups. Three groups are shown in FIG. 3, each group being connected to one of the third output signals T3',T3",T3''' in FIG. 3. In this way even more complicated test patterns, such as e.g. checkerboards, can be input into the storage cells of a respective word line WLi.

In this context express reference is made to co-pending U.S. applications Ser. Nos. 168,652 and 168,672 having the same filing date as the instant application. The bit line decoders proposed therein can advantageously replace the bit line decoders BLDEC and the switch-over device US of the present invention and permit different bit patterns to be input in parallel to all the storage cells SZ of a word line WL, in a simple manner.

Figure 2:
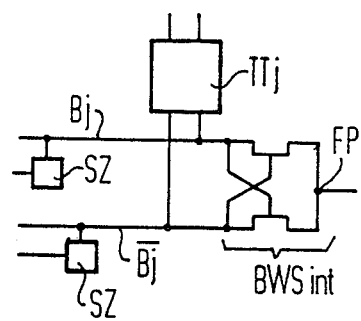
FIG. 2 is a diagram of an internal evaluator circuit in accordance with the prior art.
Figure 2:
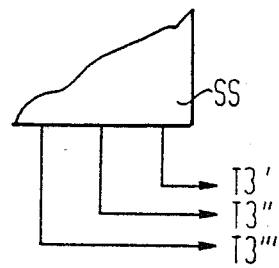

The method in accordance with the invention will be explained below in a relatively simple form making reference to the circuit configuration corresponding to the invention:

In a test pattern to be used for test purposes, in which "All 0's", for example, is to be input into the block B of the semiconductor memory, the method in accordance with the invention can be applied as follows:

Firstly all of the internal evaluator circuits BWSint are switched into an inactive state. This can be carried out in the internal evaluator circuits BWSint formed of cross-coupled transistors which are seen FIG. 2 and are currently in common use, by first holding the common base point FP of each internal evaluator circuit BWSint at a high potential (a positive logic such as, for example, in the case of CMOS or n-channel technology). Then, in the usual way, all of the internal bit lines Bj, $\overline{Bj}$ are precharged to a precharge level which is determined by the readout principle being used. Although the previous practice was to precharge to the supply potentials VSS and VCC, currently the so-called mid-level concept is being used to an increasing extent, in which a precharge to half the supply voltage (VSS+VCC)/2 takes place. The precharging, which is to be carried out in FIG. 1, for example, in accordance with the mid-level concept, is effected by a precharge pulse PC through precharge transistors TP. No further details will be given herein since the precharging forms part of the prior art.

Control signals P1 to Pk are connected to the control circuit SS no later than the end of the precharging, which will be explained in further detail below. With the assistance of the control circuit SS, these control signals P1 to Pk determine whether or not a parallel input of data into a plurality of storage cells SZ of a word line WLi is simultaneously desired, and if so which test pattern is to be used. In the embodiment under discussion, the first output signal T1 is activated and switches through the switching transistors ST which connects the potentials POT1 and POT2 to the data input circuit DIN. The second output signal T2 of the control circuit SS is connected to the data input circuit DIN. The data input circuit DIN connects a specific logic level D to the first half XB of the external collective bit line XB,$\overline{XB}$ through the external evaluator circuit BWSext by means of the potentials POT1 and POT2, and it connects a logic level $\overline{D}$, which is complementary to this specified logic level D, t the second half $\overline{XB}$ of the external collective bit line XB, $\overline{XB}$. The determination as to which logic level (0 or 1) is connected as the logic level D to the first half XB, and which logic level $\overline{D}$ is accordingly connected to the second half $\overline{XB}$ of the external collective bit line, XB, $\overline{XB}$ is decided by the status of the second output signal T2. This is determined by the control signals P1 to Pk through the control circuit SS since the control signals P1 to Pk determine which test bit pattern is to be input into the semiconductor memory. Due to the dependency upon the test pattern, there is a dependency upon the activation of the word lines WLi through the word line decoders WLDEC.

In this example a logical "1" is connected to the first half XB of the external collective bit line XB, $\overline{XB}$. Consequently a logic "0" is connected to the second half $\overline{XB}$ of the external collective bit line XB, $\overline{XB}$. Then, while being controlled by the further transfer transistor pairs WTTj of the switch-over device US, for at least two internal evaluator circuits BWSint and at the maximum of all of the internal evaluator circuits BWSint, the transfer transistor pairs TTj assigned thereto are switched so as to be electrically conductive. As a result the data items D, $\overline{D}$, which are to be input and which are supplied through the external collective bit line XB, $\overline{XB}$ are transferred in the form of logic levels to the internal bit lines Bj, $\overline{Bj}$ which are connected to the switched-through transfer transistor pairs TTj, and to the (inactivated) internal evaluator circuits BWSint. The word line WLi is then activated. As a result the data items, D, $\overline{D}$ are input into all of the storage cells SZ which are connected on one hand to the activated word line WLi and on the other hand to those internal bit lines Bj, $\overline{Bj}$ whose associated transfer transistor pairs TTj have been switched so as to be electrically conductive. Then the word line WLi is de-activated again.

Figure 4:
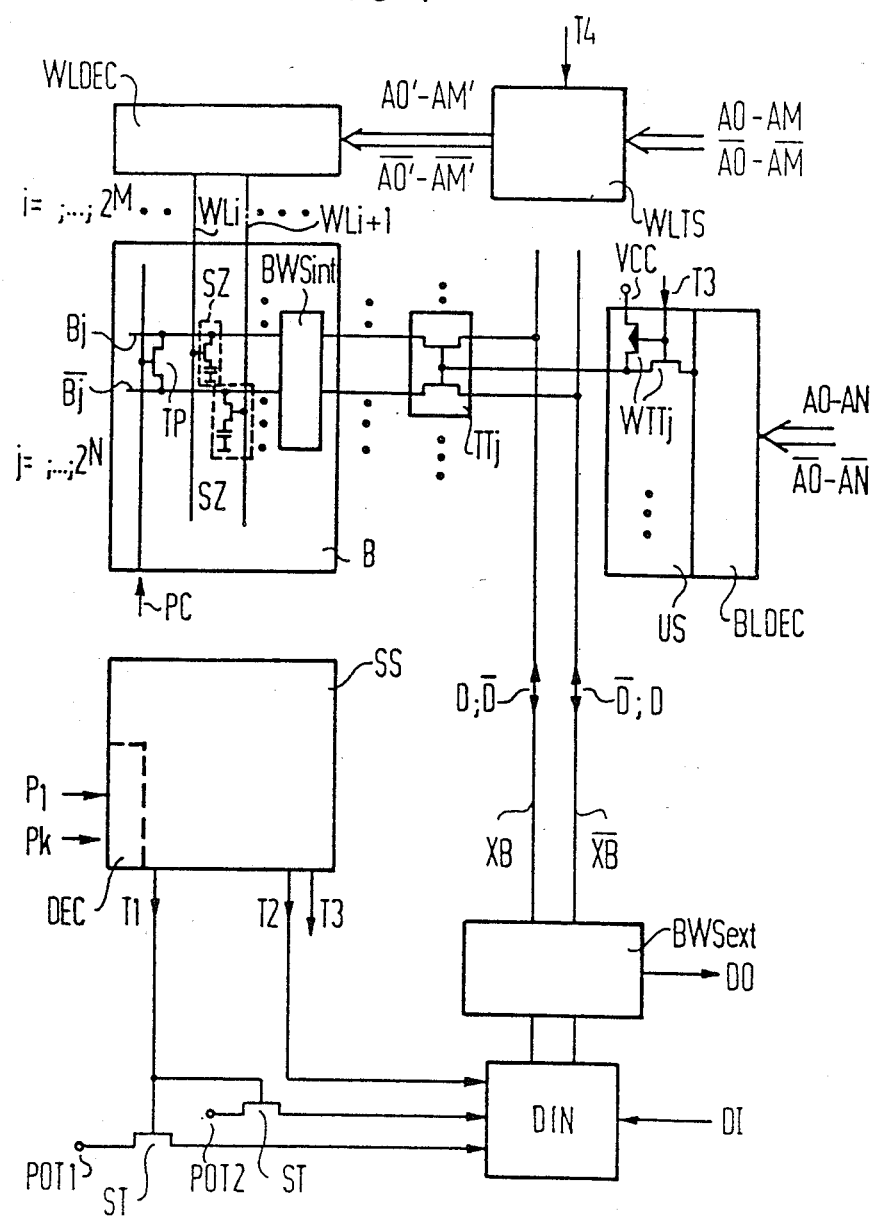
FIG. 4 is a diagram of another embodiment of the circuit configuration.

If the data items D, $\overline{D}$ which occur on the first and second halves of the external collective bit line XB, $\overline{XB}$ are to be input into storage cells SZ which are connected to word lines other than the already-activated word line WLi, these other word lines WLi are consecutively-activated and de-activated again, so that the input takes place. If the block B of the semiconductor memory includes word line decoder devices which allow more than one word line WLi to be simultaneously activated as seen in FIG. 4, the storage cells SZ into which data is to be input that is the same as that occurring on the two halves of the external collective bit line XB, $\overline{XB}$ and which are disposed on different word lines WLi, are written into simultaneously since the respective word lines WLi are simultaneously activated and de-activated which is rendered possible by word line decoders WLDEC.

Under ideal conditions all of the word lines WLi can be simultaneously activated (for example by means of a device similar to the switch-over device US). A logical '1' (logical '0') is to be input into all of the storage cells SZ which are connected to the first half of the bit lines Bj, $\overline{Bj}$ assigned thereto. The complementary value logical '0' (logical '1') is to be input into all of the storage cells SZ which are connected to the second half of the bit lines Bj, $\overline{Bj}$ assigned thereto. Since all of the transfer transistor pairs TTj can br switched so as to be electrically conductive simultaneously, one single cycle is sufficient to simultaneously write into all of the storage cells SZ of the block B of the semiconductor memory. For this purpose, however, high currents are required which in practice leads to an extension of the write cycle in comparison to conventional write cycles. As a result, the necessary energy supply is non-critically distributed over a longer period of time.

However, in the embodiment under discussion, which has been deliberately kept very simple with respect to the test pattern used, all ('1's) those storage cells SZ which are connected to the second half $\overline{Bj}$ of the respective internal bit line thereof need not necessarily be written into since this second half has the logical status 0. Thus in the embodiment under discussion, those storage cells SZ which are connected to the first half Bj of the respective internal bit line thereof are written into simultaneously or consecutively, but a plurality of all of the storage cells SZ of a word line WLi is always written into simultaneously.

When this has been carried out, the internal bit lines Bj, $\overline{Bj}$ must be recharged, i.e. they must attain a logical state (Bj:. D=0, $\overline{Bj}$: $\overline{D}$=1) which is complementary to the previous logical state thereof (Bj: D=1, $\overline{Bj}$: $\overline{D}$=0). For this purpose, all of the internal bit lines Bj, $\overline{Bj}$ are first precharged to the precharge level thereof through the precharge transistors TP, as already described in the foregoing. The first half XB of the external collective bit line is then charged with the logical level 0, which is complementary to its previous level (logical 1), and correspondingly the second half $\overline{XB}$ of the external collective bit line is charged with the level logical 1 which is complementary to the previous level thereof (logical 0). This is carried out through the data input circuit DIN in association with the second output signal T2 of the control circuit SS, which is an output signal that has a logical status complementary to the previous status thereof.

From this time on, a procedure similar to that already described above is adopted for the remaining storage cells SZ which are yet to be described. First, the transfer transistor pairs TTj assigned to at least two and maximally all of the internal evaluator circuits BWSint are switched so as to be electrically conductive so that the logic levels D,$\overline{D}$ of the external collective bit line XB, $\overline{XB}$ are fed through the transfer transistor pairs TTj, which have been switched so as to be electrically conductive, to the internal bit lines Bj, $\overline{Bj}$ . Then those word lines WLi having connected storage cells SZ that have not yet been written into (or into which an undesired data item has been written), are driven individually or in series in groups or all simultaneously, so that the storage cells SZ driven through the internal bit lines Bj, $\overline{Bj}$ and the word lines WLi, are written into.

In this way, in a test situation, all of the storage cells of a semiconductor memory can be jointly written into very rapidly and without a high outlay in terms of circuitry and space so that, for example, simple test patterns with a regular setup are input simultaneously into all of the storage cells SZ of a word line WLi. When a modern DRAM is used as a semiconductor storage module, such as e.g. an 1MB-DRAM with 1024 words × 1024 columns, in order to input the test pattern "All 1's" used in the example, instead of 1024 × 1024 = 1,048,576 write cycles only 1024 write cycles are required if each word line WLi is driven individually but all of the respective storage cells SZ connected with respect to each word line WLi are written into.

In an advantageous further development of the invention, at least those internal evaluator circuits BWSint having associated transfer transistor pairs TTj which are switched so as to be electrically conductive are activated when the transfer transistor pairs have been switched so as to be conductive, so that they can fulfill the amplification function thereof (which takes place in read operation anyway) with respect to the logic signals D, $\overline{D}$ on the assigned internal bit line Bj, $\overline{Bj}$ thereof. This speed up transfer of the logic levels, D, $\overline{D}$ of the external collective bit line XB, $\overline{XB}$ to the corresponding internal bit lines Bj, $\overline{Bj}$. However, this further development requires that the internal evaluator circuits BWSint must first be de-activated prior to the change in the logic levels D, $\overline{D}$ on the external collective bit lines XB, $\overline{XB}$, so that the subsequent precharging of the internal bit lines Bj, $\overline{Bj}$ can take place.

It is also advantageous in the case of semiconductor memories having storage cells SZ that are subdivided into individual identical blocks B, for example in accordance with European Application No. 0 186 040, corresponding to allowed U.S. application Ser. No. 811,932, that the process is carried out with respect to each block B, whereas the process is carried out simultaneously for all of the blocks B in accordance with European Application No. 0 186 040, corresponding to allowed U.S. application Ser. No. 811,932. Thus it is possible to input data into all of the storage cells SZ in a block B which are disposed on a word line WLi, and to likewise simultaneously input data in each of the other blocks B into all of the storage cells SZ of the word line WLi which corresponds in the addressing thereof within the block B thereof to that of the first-mentioned block B.

The advantageous configuration for the implementation of the method has already been described in the foregoing. According to a further development of the invention, it is advantageous for the control circuit SS to include a decoder section DEC which analyses the control signal Pl to Pk. On one hand the decoder section DEC recognizes whether or not a parallel input into the storage cells SZ of a word line WLi is desired. On the other hand it recognizes which of various possible test patterns is desired.

The control signals Pl to Pk can be signals which are connected through separate terminals to the semiconductor memory. However they can also be signals which are supplied through terminals already provided in the semiconductor memory, such as address signal terminals. In this case it is necessary to construct the decoder section DEC in such manner that it can recognize whether "normal" address signals are externally supplied to the semiconductor memory or whether the control signals Pl to Pk occur in accordance with the present invention. Several possibilities are available to those skilled in the art for the solution of this problem: On one hand the decoder section DEC can be constructed in such a manner that it recognizes signals externally supplied to the semiconductor memory as controls signals Pl to Pk when (at least) one of them has a signal level which is distinctly higher than the logic levels which normally occur in the semiconductor memory. This can be determined, for example, by means of a voltage discriminator circuit, that is found in European Pat. No. 0 046 215 corresponding to U.S. Pat. No. 4,458,338. However, it is also possible to first supply the semiconductor memory with a special signal combination and signal sequence which switches the semiconductor memory into test operation through the decoder section SEC, in which the above-described parallel input of data can take place. When a test has been performed, the semiconductor memory is supplied with a further special signal combination and signal sequence which switches back the semiconductor memory (and thus also the control circuit SS) to normal operation. Corresponding signal combinations and signal sequences for controlling and triggering special functions of a semiconductor memory will already be familiar to those skilled in the art. For example a "JEDEC Mos Memory Meeting" was held from Sept. 9-11, 1986 in Minneapolis, Minn. to advise on a future standard for such signal combinations and signal sequences.

The core of the control circuit SS advantageously includes a PLA-circuit. This fundamentally contains information relating to the test patterns provided by the manufacturer of the semiconductor memory. The PLA-circuit is driven by the decoder section DEC, which in fact analyses the control signal Pl to Pk, when the operating mode "parallel input into a plurality of cells of a block" is recognized, by means of internal control signals generated by the decoder section. The PLA-circuit generates the output signals T1 . . . of the control circuit SS in dependence upon the circuit structure and the internal control circuit thereof.

In place of the PLA-circuit, the control circuit SS can also include a non-volatile storage section of the ROM, PROM, etc. type. The function thereof is similar to that of the PLA-circuit.

In an advantageous further development of the invention shown in FIG. 4, the word line decoders WLDEC are preceded by a word line address separating circuit WLTS, having an input connected on one hand to a fourth output signal T4 of the control circuit SS and on the other hand to address lines A0 to AM, $\overline{A0}$ to $\overline{AM}$, which normally serve to address the word lines WLi through the word line decoders. In normal operation, the address lines AO to AM, $\overline{AO}$ to $\overline{AM}$ are switched through to the word line decoders WLDEC, so that the word line decoders WLDEC can be driven by address signals externally supplied to the semiconductor memory. When data is to be input in parallel into a plurality of storage cells SZ of at least one word line WLi, i.e. in test operation, in a first embodiment of the word line address separating circuit WLTS the fourth output signal T4 of the control circuit SS causes the word line address separating circuit WLTS to drive the word line decoders WLDEC in such a manner that the word lines WLi are activated individually in turn for the input of the data. In a second embodiment the word lines WLi are activated consecutively in groups. In a third embodiment all of the word lines WLi are activated simultaneously for the input. Due to the high energy required for this purpose, in such a case on one hand the voltage supply of a semiconductor memory must be constructed so as to be appropriately powerful, and on the other hand the (single) input cycle must be expected to be somewhat longer in length than usual due to of the increased energy requirement of the semiconductor memory.

We claim:

1. Method for the parallel input of data items in the form of a test pattern into a block of a semiconductor memory including a plurality of storage cells and internal evaluator circuits in the block, internal bit lines connected to the storage cells and the internal evaluator circuits, an external collective bit line having first and second halves connected to the internal bit lines, transfer transistor pairs connected to the internal bit lines, and at least one word line connected to the storage cells, which comprises:

(a) switching all of the internal evaluator circuits into an inactive state;

(b) precharging all of the internal bit lines to a given precharge level;

(c) charging the first half of the external collective bit line to a first logic level, charging the second half of the external collective bit line to a second logic level complementary to the first logic level, at least one of the logic levels corresponding to data items to be input;

(d) switching transfer transistor pairs, having a selected assignment to at least two of the internal evaluator circuits, into electrical conductivity for feeding the logic levels occurring on the external collective bit line to the internal bit lines;

(e) driving the at least one word line connected to the storage cells while inputting desired data items into storage cells connected both to a driven word line and to internal bit lines associated with transfer transistor pairs having been switched into electrical conductivity;

(f) repeating step (e) while driving at least one previously undriven word line for each repetition until data has been input into all of the storage cells of the block which can be written into on the basis of the selected assignment between the external collective bit line and the two logic levels; and (g) repeating steps (b) through (f) while interchanging the selected assignment between the external collective bit line and the two logic levels if the desired test pattern has not yet been written into all of the storage cells after the last repetition of step (f).

2. Method according to claim 1, which comprises switching into conductivity at least the internal evaluator circuits associated with transfer transistor pairs having been switched into electrical conductivity, and repeating step (a) before each repetition of steps (b) through (f), in order to accelerate the input of the data items into the storage cells in accordance with step (d).

3. Method according to claim 1, which comprises initially selecting a logical "1" as the first logic level.

4. Method according to claim 1, which comprises initially selecting a logical "1" as the first logic level.

5. Method according to claim 1, which comprises applying steps (a) through (g) simultaneously and in parallel to storage blocks of semiconductor memories including a plurality of mutually identical storage blocks.

6. Circuit configuration for the parallel input of data items in the form of a test pattern into a block of a semiconductor memory, comprising:

a semiconductor memory including at least one block having $2^{N+M}$ storage cells disposed in the form of a matrix;

word lines and internal bit lines connected to said storage cells for addressing said storage cells;

word line decoders connected to said word lines for activating said word lines, bit line decoders connected to said internal bit lines for activating said internal bit lines;

internal evaluator circuits each being assigned to a respective one of said internal bit lines and dividing said internal bit lines into two halves;

transfer transistor pairs each being connected to a respective one of said internal evaluator circuits; an external collective bit line being connected to said transfer transistor pairs and having first and second halves;

a data input circuit; an external evaluator circuit connected between said external collective bit line and said data input circit for amplifying data read out from said semiconductor memory, for transmitting the amplified data, for receiving data input in the form of logic levels into said semiconductor memory from said data input circuit and for transferring the received data to said external collective bit line;

switching transistors each being connected to a respective one of said data input circuits for feeding respective potentials each having one of two logic levels, to said data input circuit;

a control circuit having an input receiving control signals containing information as to whether or not parallel input is to take place and as to which test pattern is to be used therefor;

said control circuit having a first output connected to one of said switching transistors for feeding a first output signal driving said one switching transistor, said control circuit having a second output connected to said data input circuit for feeding a second output signal controlling said data input circuit as to which of said potentials is to be applied as said first logic level through said external evaluator circuit to said first half of said external collective bit line and which of said potentials is to be applied as said second logic level through said external evaluator circuit to said second half of said external collective bit line, said control circuit having at least one third output connected to said bit line decoders for feeding at least one third output signal; and said bit line decoders having a switch-over device receiving said at least one third output signal for parallel activation of at least a plurality of said transfer transistor pairs.

7. Circuit configuration according to claim 6, wherein said control circuit includes a decoder section analyzing said control signals.

8. Circuit configuration according to claim 6, wherein said control circuit includes a PLA-circuit.

9. Circuit configuration according to claim 6, wherein said control circuit includes a non-volatile storage circuit.

10. Circuit configuration according to claim 6, wherein said bit line decoder has an output, said transfer transistor pair is a first transfer transistor pair formed of two transistors with gate terminals, said switch-over device includes a second transfer transistor pair formed of first and second mutually-complementary transistors for each internal bit line having gate, source and drain terminals, the source and drain terminals of said first transistor of said second transistor pair is connected between the gate terminals of said first transfer transistor pair of an internal bit line and said output of said bit line decoder assigned to a respective internal bit line, said second transistor of said second transistor pair is connected between a supply potential of the circuit configuration and the gate terminals of said first transfer transistor pair, and the gate terminals of said first and second transistors of said second transfer transistor pair are connected to said third output of said control circuit.

11. Circuit configuration according to claim 6, wherein said at least one third output of said control circuit is in the form of three third outputs for feeding three third output signals, said bit line decoder has an output, said transfer transistor pair is a first transfer transistor pair formed of two transistors with gate terminals, said switch-over device includes a plurality of second transfer transistor pairs each being formed of first and second mutually-complementary transistors for each internal bit line having gate, source and drain terminals, the source and drain terminals of said first transistor of each of said second transistor pairs is connected between the gate terminals of said first transfer transistor pair of an internal bit line and said output of said bit line decoder assigned to a respective internal bit line, said second transistor of each of said second transistor pairs are connected between a supply potential of the circuit configuration and the gate terminals of said first transfer transistor pair, and the gates of said first and second transistors of all of said second transfer transistor pairs are connected in groups to said third outputs of said control circuit.

12. Circuit configuration according to claim 6, wherein said control circuit has a fourth output feeding a fourth output signal, and including address lines for addressing said word lines, a word line address separating circuit having an input connected to said fourth output and to said address lines, said word line address separating circuit having means for switching through said word lines to said word line decoders in normal operation and means for blocking said address lines and for driving said word line decoders in test operation, so that said address lines drive at least one word line in sequence for inputting.

13. Circuit configuration according to claim 6, wherein said control circuit has a fourth output feeding a fourth output signal, and including address lines for addressing said word lines, a word line address separating circuit having an input connected to said fourth output and to said address lines, said word line address separating circuit having means for switching through said word lines to said word line decoders in normal operation and means for blocking said address lines and for driving all of said word line decoders in parallel so that said address lines drive all of said word lines simultaneously for inputting.

* * * * *